(12) United States Patent
Wang et al.

(10) Patent No.: US 11,313,827 B2
(45) Date of Patent: Apr. 26, 2022

(54) SENSOR DEVICES FOR DETECTING A PH CHANGE IN A SOLUTION

(71) Applicant: GLOBALFOUNDRIES Singapore Pte. Ltd., Singapore (SG)

(72) Inventors: Lanxiang Wang, Singapore (SG); Bin Liu, Singapore (SG); Eng Huat Toh, Singapore (SG); Shyue Seng Tan, Singapore (SG); Kiok Boone Elgin Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 222 days.

(21) Appl. No.: 16/455,772

(22) Filed: Jun. 28, 2019

(65) Prior Publication Data
US 2020/0408712 A1 Dec. 31, 2020

(51) Int. Cl.
*G01N 27/41* (2006.01)
*G01N 27/414* (2006.01)
(Continued)

(52) U.S. Cl.
CPC ..... *G01N 27/4148* (2013.01); *G01N 27/4145* (2013.01); *H01L 29/04* (2013.01); *H01L 29/16* (2013.01)

(58) Field of Classification Search
CPC ............ G01N 27/4148; G01N 27/4145; H01L 29/04; H01L 29/16; H01L 21/823412; H01L 27/088; H01L 29/786; H01L 29/78
(Continued)

(56) References Cited

U.S. PATENT DOCUMENTS

2006/0273404 A1* 12/2006 Scheuerlein ...... H01L 29/42332
257/390
2009/0014757 A1* 1/2009 Takulapalli ........ G01N 27/4145
257/253
(Continued)

OTHER PUBLICATIONS

Prodromakis et al., "Exploiting CMOS Technology to Enhance the Performance of ISHET Sensors", IEEE Elecron Device Letters, Sep. 2010, vol. 31, No. 9, pp. 1053-1055, IEEE.
(Continued)

*Primary Examiner* — Thao X Le
*Assistant Examiner* — Laura M Dykes
(74) *Attorney, Agent, or Firm* — Viering Jentschura & Partner MBB

(57) ABSTRACT

According to various embodiments, there is provided a sensor device that includes: a substrate and two semiconductor structures. Each semiconductor structure includes a source region and a drain region at least partially disposed within the substrate, a channel region between the source region and the drain region, and a gate region. A first semiconductor structure of the two semiconductor structures further includes a sensing element electrically connected to the first gate structure. The sensing element is configured to receive a solution. The drain regions of the two semiconductor structures are electrically coupled. The source regions of the two semiconductor structures are also electrically coupled. A mobility of charge carriers of the channel region of a second semiconductor structure of the two semiconductor structures is lower than a mobility of charge carriers of the channel region of the first semiconductor structure.

12 Claims, 7 Drawing Sheets

(51) Int. Cl.
*H01L 29/16* (2006.01)
*H01L 29/04* (2006.01)

(58) Field of Classification Search
USPC .......................................................... 257/253
See application file for complete search history.

(56) References Cited

U.S. PATENT DOCUMENTS

| | | | | |
|---|---|---|---|---|
| 2009/0114971 | A1* | 5/2009 | Cai | ......................... H01L 21/84 |
| | | | | 257/315 |
| 2012/0305893 | A1* | 12/2012 | Colinge | ............. H01L 29/66795 |
| | | | | 257/29 |
| 2013/0285149 | A1* | 10/2013 | Fonash | ............... H01L 29/0665 |
| | | | | 257/368 |
| 2013/0299771 | A1* | 11/2013 | Youn | .................... H01L 27/092 |
| | | | | 257/9 |
| 2014/0139204 | A1* | 5/2014 | Bashir | ................ G01N 33/5438 |
| | | | | 324/123 R |

OTHER PUBLICATIONS

Go et al., "Beating the Nernst limit of 59mV/pH with Double-Gated Nano-Scale Field-Effect Transistors and Its Applications to Ultra-Sensitive DNA Biosensors", 2010 International Electron Devices Meeting, 2010, pp. 202-205, IEEE.

Go et al., "Coupled Heterogeneous Nanowire-Nanoplate Planar Transistor Sensors for Giant (>10 V/pH) Nernst Response", ACS Nano, 2012, vol. 6, No. 7, pp. 5972-5979.

Rung et al., "Deep Trench Isolated CMOS Devices", 1982 International Electron Devices Meeting, 1982, 7 pages, IEEE.

* cited by examiner

SENSOR DEVICES FOR DETECTING A PH CHANGE IN A SOLUTION

TECHNICAL FIELD

Various embodiments relate to sensor devices and methods of fabricating sensor devices.

BACKGROUND

Sensors are often used in biomedical processes for converting biochemical reactions into electrical signals, for example, converting pH changes in a solution caused by biochemical reactions into electrical signals. Prior art sensors include ion-sensitive field-effect transistors (ISFETs), which can convert biochemical reactions into electrical signals with a certain degree of effectiveness. The use of ISFETs helps to achieve lower cost, higher throughput and a label free biomolecule detection. Further, ISFETs can be manufactured using mainstream CMOS technology. However, the sensitivity of conventional ISFETs is often defined by 59 mV/pH, which is the Nernst limit associated with an electrolyte and a site-binding surface. Such a sensitivity level may not be adequate for some applications such as human genome sequencing. To date, various sensors with improved sensitivity have been developed for use in biomedical processes. Examples of such sensors include dual gate ISFETs having an additional back gate and sensors having dual transistors.

Although prior art sensors may be capable of converting biochemical reactions into electrical signals by detecting pH changes in a solution, the process of fabricating a nanowire transistor requires changes to existing FET fabrication processes, but this increases the production complexity and cost.

SUMMARY

According to various non-limiting embodiments, there may be provided a sensor device including: a substrate; a first semiconductor structure; and a second semiconductor structure. The first semiconductor structure may include: a first source region at least partially disposed within the substrate; a first drain region at least partially disposed within the substrate; a first channel region between the first source region and the first drain region, wherein the first channel region includes a first conductive material; a first gate structure disposed over the first channel region; and a sensing element electrically connected to the first gate structure where the sensing element is configured to receive a solution. The second semiconductor structure may include: a deep trench isolation structure disposed within the substrate where the deep trench isolation structure is filled with a second conductive material; a second source region at least partially disposed within the deep trench isolation structure; a second drain region at least partially disposed within the deep trench isolation structure; a second channel region disposed within the deep trench isolation structure where the second channel region is disposed between the second source region and the second drain region; and a second gate structure disposed over the second channel region. The first drain region may be electrically coupled to the second drain region. The first source region may be electrically coupled to the second source region. A mobility of charge carriers of the second conductive material may be lower than a mobility of charge carriers of the first conductive material.

According to various non-limiting embodiments, there may be provided a sensor device including: a substrate, a first semiconductor structure, and a second semiconductor structure. The first semiconductor structure may include: a first source region at least partially disposed within the substrate; a first drain region at least partially disposed within the substrate; a first channel region disposed within the substrate, between the first source region and the first drain region where the first channel region including a first conductive material; a first gate structure disposed over the first channel region; and a sensing element electrically connected to the first gate structure where the sensing element is configured to receive a solution. The second semiconductor structure may include: a second channel structure disposed over the substrate where the second channel structure is filled with a second conductive material, a second source region at least partially disposed within the second channel structure; a second drain region at least partially disposed within the second channel structure; a second channel region disposed within the second channel structure where the second channel region is disposed between the second source region and the second drain region; and a second gate region disposed within the substrate and under the second channel region. The first drain region may be electrically coupled to the second drain region. The first source region may be electrically coupled to the second source region. A mobility of charge carriers of the second conductive material may be lower than a mobility of charge carriers of the first conductive material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1:
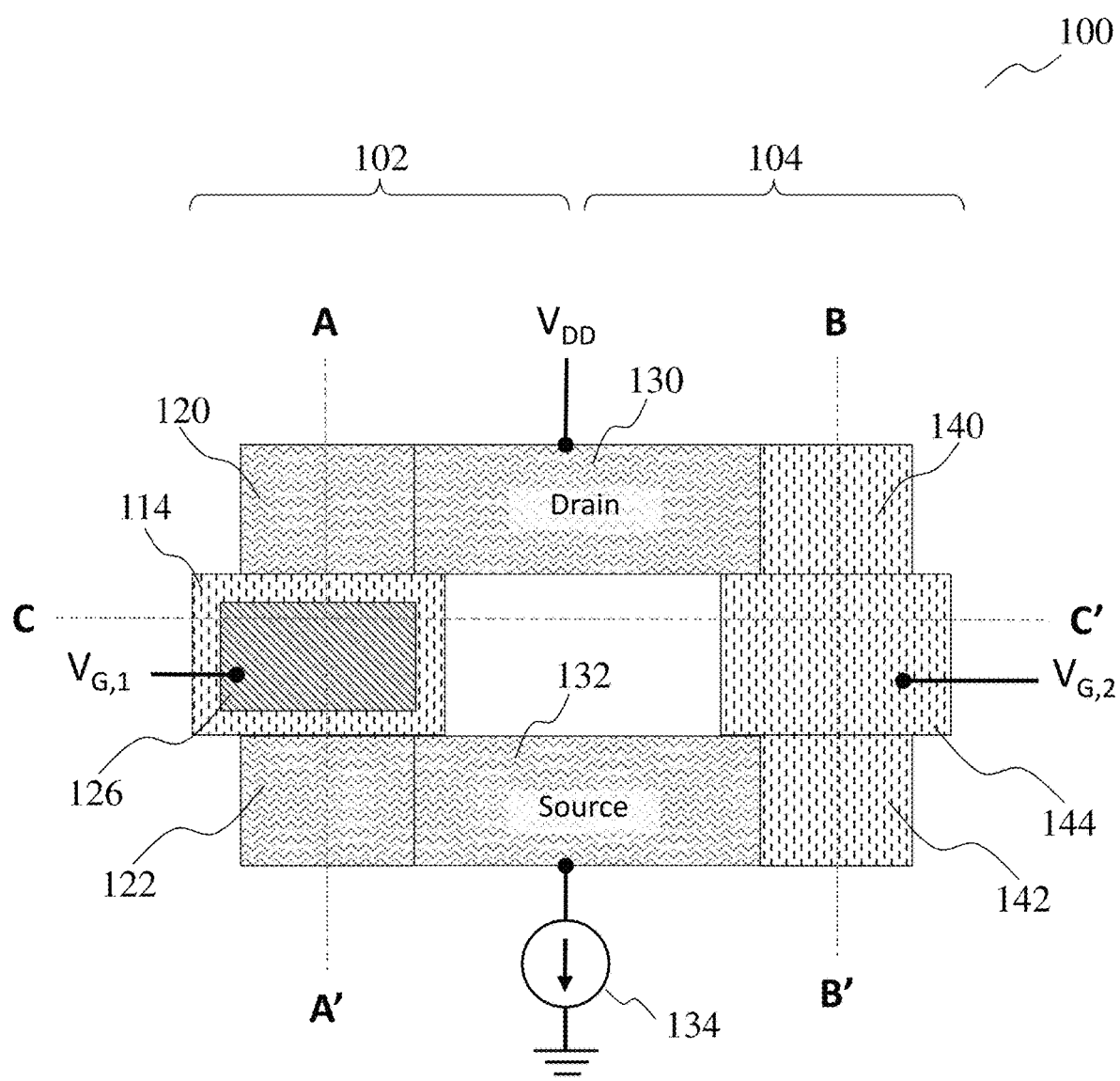
FIG. 1 shows a top view of a sensor device according to various non-limiting embodiments.

The non-limiting embodiments described below in context of the devices are analogously valid for the respective methods, and vice versa. Furthermore, it will be understood that the embodiments described below may be combined; for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

The term "coupled" (or "connected") herein may be understood as electrically coupled or as mechanically coupled, for example attached or fixed, or just in contact without any fixation, and it will be understood that both direct coupling or indirect coupling (in other words: coupling without direct contact) may be provided.

In order that the invention may be readily understood and put into practical effect, various embodiments will now be described by way of examples and not limitations, and with reference to the figures.

According to various non-limiting embodiments, a sensor device may include a first transistor that is an ISFET, and a second transistor that may be a MOSFET. The source terminals of the first transistor and the second transistor may be electrically coupled together. The drain terminals of the first transistor and the second transistor may also be electrically coupled. The ISFET and the MOSFET may be coupled together to form a coupled ISFET sensor. The channel of the first transistor may include a first conductive material, while the channel of the second transistor may include a second conductive material. The second conductive material may have a substantially lower charge carrier mobility compared to the first conductive material, thereby enhancing the sensitivity of the sensor device.

According to various non-limiting embodiments, the sensor device may detect biochemical reactions. The sensor device may be configured to detect a pH change in a solution, for example, caused by a biochemical reaction. The sensor device may convert changes in ionic concentration into electrical signals.

According to various non-limiting embodiments, the sensor device may be referred to as a coupled ion-sensitive field effect transistor (ISFET).

According to various non-limiting embodiments, the channel of the second transistor may be formed out of a deep trench isolation (DTI) structure. The DTI may be formed in a substrate, and may be lined with an insulating wall and may be filled with polysilicon. Two regions of the polysilicon may be doped to a higher concentration, to form the source and the drain terminals of the second transistor. The polysilicon that lies between the source and the drain terminals may form the channel of the second transistor.

According to various non-limiting embodiments, the channel of the second transistor may be formed using the same process as forming the gate terminal of the first transistor. The gate terminal of the second transistor may be formed in the same process as forming the channel of the first transistor. The first transistor and the second transistor may include a first well and second well respectively. The first and second wells may be formed concurrently, and may be formed in a single piece of substrate. The channel of the first transistor may be formed in the first well; whereas, the gate terminal of the second transistor may be formed in the second well. Regions in the second well may be doped to a higher charge concentration than the rest of the second well, to serve as the gate terminals. A gate terminal of the first transistor may be formed over the first well. A quasi-gate structure may be formed over the second well, at the same time as forming the gate terminal of the first transistor. The quasi-gate structure may be filled with polysilicon and may accommodate the channel of the second transistor.

According to various non-limiting embodiments, the sensor device may be fabricated, making use of planar semiconductor transistor fabrication processes, to minimise fabrication cost and complexities.

FIG. 1 shows a top view of a sensor device 100 according to various non-limiting embodiments. The sensor device 100 may include a first transistor 102 and a second transistor 104. At least one of the first transistor 102 and the second transistor 104 may be formed at least partially in a substrate 202. The substrate 202 may include silicon, which may be monocrystalline silicon. The first transistor 102 may be an ion-sensitive field effect transistor (ISFET). The first transistor 102 may include a first drain region 120, a first source region 122, a first channel region 244, and a first gate structure 114, similar to a conventional metal-oxide-semiconductor field effect transistor (MOSFET). The first drain region 120 may be arranged under the metal contact 130 and thus, not visible in the top view. The first source region 122 may similarly be arranged under a metal contact 132 and thus, also not visible in the top view. The first channel region 244 may be disposed under the first gate structure 114 and thus, may not be visible in the top view. The first transistor 102 may differ from a MOSFET, in that the first gate structure 114 may include a sensing element 126. The sensing element 126 may be configured to receive a solution-under-test. The sensing element 126 may be sensitive to hydrogen ions and may separate an input gate electrode from the underlying gate region of the first transistor 102. When in use, the input gate electrode may provide an input voltage $V_{G,1}$. When a biochemical reaction occurs in the solution-under-test, the hydrogen ion concentration of the solution-under-test may change, thereby changing the voltage received at the gate region of the first transistor 102.

The second transistor 104 may include a second drain region 140 (not visible in the top view), a second source region 142 (not visible in the top view), a second channel region 344 (not visible in the top view), and a second gate structure 144. Each of the second drain region 140, the second source region 142, the second channel region 344 and the second gate structure 144 may include polysilicon. The second transistor 104 may be a MOSFET. The second gate structure 144 may be configured to output an output voltage $V_{G,2}$. The second drain region 140 may be electrically coupled to the first drain region 120, for example, via a metal contact 130. The metal contact 130 may be arranged over a top surface of the first drain region 120 and may abut a side surface of the second drain region 140. The second source region 142 may be electrically coupled to the first source region 122, for example, via a metal contact 132. The metal contact 132 may be arranged over a top surface of the first source region 122 and may abut a side surface of the second source region 142.

In use, the first drain region 120 and the second drain region 140 may be electrically coupled to a common voltage supply $V_{DD}$; whereas, the first source region 122 and the second source region 142 may be electrically coupled to a current source 134. The current source 134 may be configured to provide a constant current flow $I_{DS}$ through the sensor device 100. The current flow $I_{DS}$ may branch into a first current flow $I_{DS,1}$ through the first transistor 102 and a second current flow $I_{DS,2}$ through the second transistor 104. The first gate structure 114 of the first transistor 102 may be configured to control the first current flow through the first transistor 102 based on the voltage $V_{G,1}$. When a pH of the solution-under-test changes, the voltage $V_{G,1}$ changes and consequently, the first current flow through the first transistor 102 changes. As the current source 134 maintains $I_{DS}$ at a constant current, the second current flow through the second transistor 104 changes to compensate for the change in the first current flow through the first transistor 102. This in turn changes the output voltage $V_{G,2}$ at the second gate structure 144 of the second transistor 104. The pH changes in the solution-under-test may be detected based on the amount of change in $V_{G,2}$.

The change in the first current flow, $\Delta I_{DS,1}$, may be expressed as:

$$\Delta I_{DS,2} = \mu_1 * C_{OX,1} * (W_1/L_1) * V_{DS,1} * \Delta V_{G,1} \quad \text{Equation (1)}$$

The change in second current flow, $\Delta I_{DS,2}$, may be expressed as:

$$\Delta I_{DS,2} = \mu_2 * C_{OX,2} * (W_2/L_2) * V_{DS,2} * \Delta V_{G,2} \quad \text{Equation (2)}$$

where μ is the mobility of charge carriers, $C_{OX}$ is the gate capacitance, W is the gate width, L is the gate length, $V_{DS}$ is the drain-to-source bias and $\Delta V_G$ is the change in the gate voltage, of the respective transistors.

A constant $I_{DS}$ may be forced from the source regions 122 and 142 to the drain regions 120 and 140. In other words, the combined current flow may be maintained at a constant current.

$$I_{DS} = I_{DS,1} + I_{DS,2} = \text{constant}$$

$$\Delta I_{DS,1} + \Delta I_{DS,2} = 0$$

The bias of the second transistor 104 may be adjusted to counterbalance the conductance modulation of the first transistor 102, so that $$\frac{\Delta V_{G,2}}{\Delta V_{G,1}} = \left( \frac{\mu_1}{\mu_2} \frac{\left(\frac{W}{L}\right)_1}{\left(\frac{W}{L}\right)_2} \frac{V_{DS,1}}{V_{DS,2}} \right) \frac{C_{OX,1}}{C_{OX,2}} = \text{SensitivityGain} \quad \text{Equation (3)}$$

The sensor device 100 may achieve a high value of $\mu_1/\mu_2$, by having a low carrier mobility for the second transistor 104, as compared to the carrier mobility of the first transistor 102, i.e. $\mu_2 \ll \mu_1$. The channel material of the first transistor 102 may be, but not limited to, monocrystalline silicon, while the channel material of the second transistor 104 may be, but not limited to, polysilicon.

According to various non-limiting embodiments, the first source region 122 and the second source region 142 may be distinct regions; and the first drain region 120 and the second drain region 140 may also be distinct regions. However, in alternative non-limiting embodiments, the first source region 122 and the second source region 142 may be integrally formed as a single source region, and the first drain region 120 and the second drain region 140 may also be integrally formed as a single drain region.

FIGS. 2A-2D show cross-sectional views along the line C-C' (shown in FIG. 1) of the sensor device 100 at various stages of fabrication. These cross-sectional views may be simplified views that only show part of the sensor device 100. For example, these cross-sectional views may omit at least one metal layer such as the global interconnects and the local interconnects.

Figure 2A:
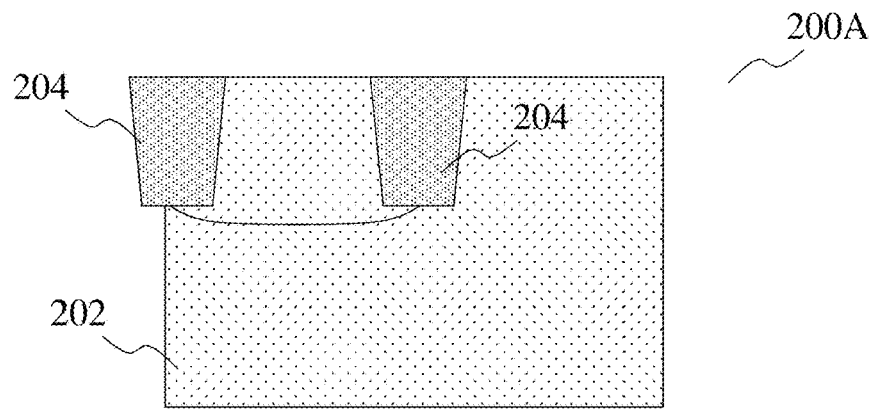
FIGS. 2A-2D show cross-sectional views along a line C-C' indicated in FIG. 1, of the sensor device of FIG. 1 at various stages of fabrication.

FIG. 2A illustrates a cross-sectional view in relation to a process 200A in a method of fabricating the sensor device 100 according to various non-limiting embodiments. The process 200A may include forming isolation regions 204 in the substrate 202. The substrate 202 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI), silicon germanium substrates, or combinations thereof, and the like. The substrate 202 may in addition or instead include various isolations, dopings, and/or device features. The substrate 202 may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), indium antimonide (InSb), or combinations thereof; an alloy semiconductor including GaAsP, AlInAs, GaInAs, GaInP, GaInAsP, silicon germanium (SiGe), germanium tin (GeSn), silicon germanium tin (SiGeSn) or combinations thereof. Other types of materials as known to those skilled in the art may also be useful for forming the substrate 202. The isolation regions 204 may be provided in the form of shallow trench isolation (STI). The isolation regions 204 may be disposed within the substrate 202. At least one isolation region 204 may isolate the first transistor 102 from the second transistor 104 when the sensor device 100 is formed. The isolation regions 204 may also isolate the sensor device 100 from external interference, such as interference from neighboring devices. Each isolation region 204 may include an isolation material, such as but not limited to, a gap fill oxide or nitride, or a combination of both. Each isolation region 204 may have a width ranging from about 0.05 um to about 10 um in a non-limiting embodiment.

Figure 2B:
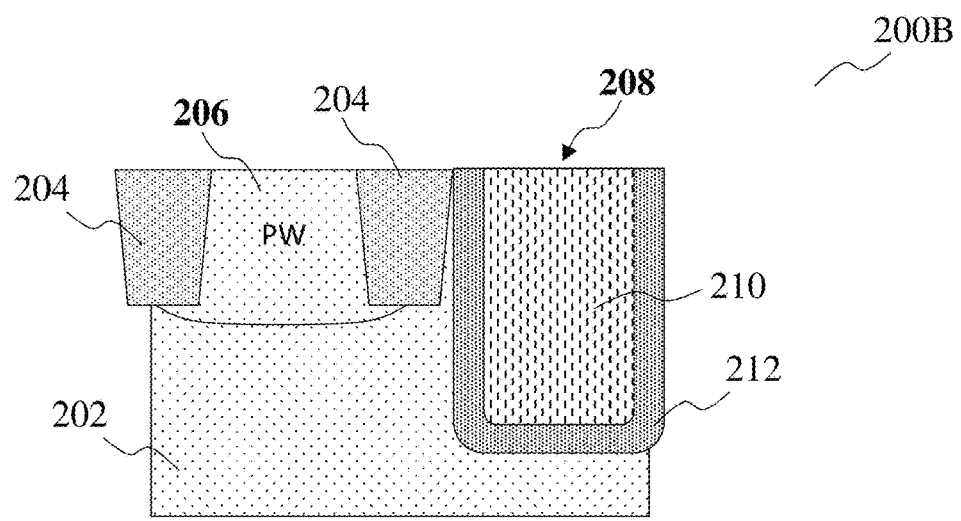

FIG. 2B illustrates a cross-sectional view in relation to a process 200B in a method of fabricating the sensor device 100 according to various non-limiting embodiments. The process 200B may include forming a first well 206 and a second well 210. Forming the first well 206 may include doping a region of the substrate 202 between the isolation regions 204, for example, to have p-type conductivity. As such, the first well 206 may have the same material as the substrate 202, which may be referred herein as a first conductive material. The process 200B may also include forming a deep trench isolation (DTI) structure 208. Forming the DTI structure 208 may include forming a deep trench in the substrate 202, adjacent to an isolation region 204 that borders the first well 206. Forming the DTI structure 208 may further include coating the deep trench with an insulator material, such as an oxide, to form an insulator lining 212. Forming the DTI structure 208 may further include depositing a second conductive material into the deep trench to form the second well 210. The second conductive material may be, for example, polysilicon. The first well 206 may be the starting structure for forming the channel region of the first transistor 102, while the second well 210 may be the starting structure for forming the channel region of the second transistor 104. The process 200B may also include forming a first source region 122 and a first drain region 120 in the first well 206, and forming a second source region 142 and a second drain region 140 in the second well 210. Forming the source and drain regions may include doping regions in the first well 206 and in the second well 210. In one non-limiting embodiment, the first source and drain regions 122, 120, and the second source and drain regions 142, 140 may have the same doping concentration (i.e. the same concentration of dopants). Alternatively, the doping concentration of the source and drain regions 122, 120, 142, 140 may be different from each other. In a non-limiting example, the second source region 142 may include a lower concentration of dopants as compared to the first source region 122, and the first and second drain regions 120, 140 may include an equal concentration of dopants. In an alternative non-limiting example, the second drain region 140 may include a lower concentration of dopants as compared to the first drain region 120, and the first and second source regions 122, 142 may include a same concentration of dopants. In yet another alternative non-limiting example, the second source region 142 may include a lower concentration of dopants as compared to the first source region 122, and the second drain region 140 may include a lower concentration of dopants as compared to the first drain region 120. The first source region 122 may include a concentration of dopants ranging from about 1e19 $cm^{-3}$ to about 5e20 $cm^{-3}$ in a non-limiting embodiment. The second source region 142 may include a concentration of dopants lower than 1e19/$cm^{-3}$, for example ranging from about 5e17 $cm^{-3}$ to about 5e18 $cm^{-3}$ in a non-limiting embodiment. The first drain region 120 may include a concentration of dopants ranging from about 1e19 $cm^{-3}$ to about 5e20 $cm^{-3}$. The second drain region 140 may include a concentration of dopants lower than 1E19/$cm^{-3}$, for example ranging from about 5e17 $cm^{-3}$ to about 5e18 $cm^{-3}$ in a non-limiting embodiment.

Figure 2C:
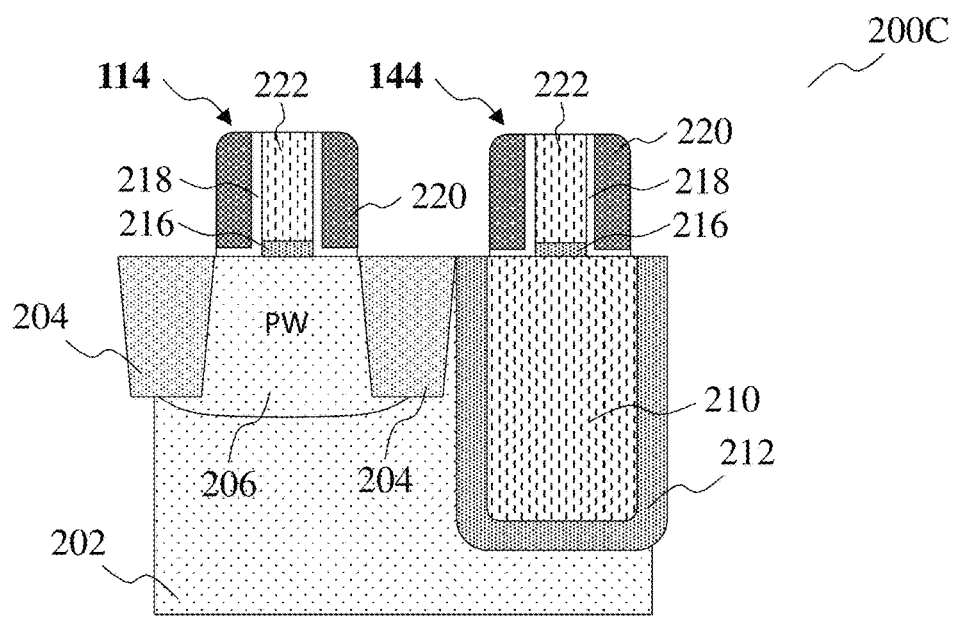

FIG. 2C illustrates a cross-sectional view in relation to a process 200C in a method of fabricating the sensor device 100 according to various non-limiting embodiments. The process 200C may include forming a first gate structure 114 for the first transistor 102 and a second gate structure 144 for the second transistor 104. The semiconductor device shown in FIG. 2B may be planarized using chemical mechanical planarization (CMP), to achieve a flat and smooth surface for receiving the first gate structure 114 and the second gate structure 144. The first gate structure 114 and the second gate structure 144 may be fabricated concurrently, in the same process. Forming the first gate structure 114 may include depositing an oxide over the first well 206 to form a gate oxide region 216, providing spacers 218 adjacent to the gate oxide regions, forming insulation walls 220 adjacent to the spacers 218, and providing a conductive material between the spacers 218 to form the gate region 222. The gate oxide region 216 may be formed of any gate oxide material known in the art, such as high-k dielectrics or silicon dioxide in a non-limiting example. The first gate structure 114 and the second gate structure 144 may be identically, or at least substantially similar. As such, the process of forming the second gate structure 144 may be identical to the process of forming the first gate structure 114, except that the second gate structure 144 may be formed over the second well 210. Alternatively, the first gate structure 114 may be in the form of a floating-gate structure including a cavity for receiving the solution, an intermediate layer, for example, a passivation layer beneath the cavity to detect changes in the amount and/or type of ions of the solution, and a sensing element disposed beneath the passivation layer. Other types of structures as known to those skilled in the art may also be useful for forming the first gate structure 114. The process 200C may also include deposition of the interlayer dielectric (ILD). A metallization layer may be deposited, to form electrical contacts. Back end of line (BEOL) processes may be carried out to connect devices in the semiconductor device with wiring on the wafer.

Figure 2D:
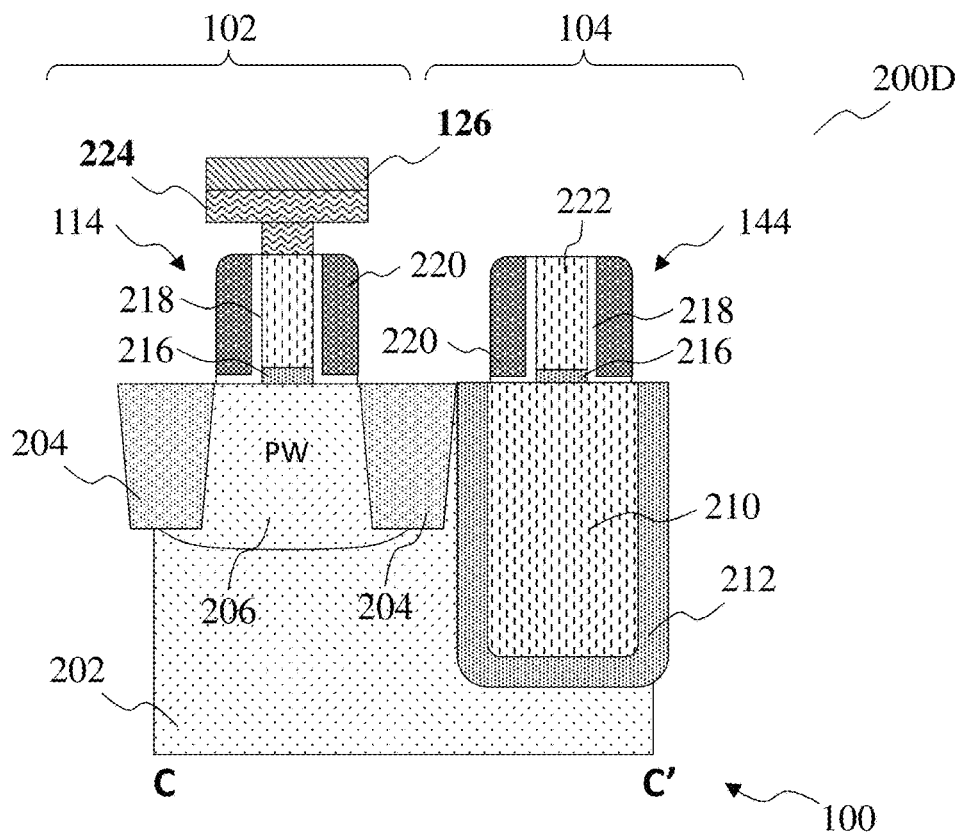

FIG. 2D illustrates a cross-sectional view in relation to a process 200D in a method of fabricating the sensor device 100 according to various non-limiting embodiments. The process 200D may include depositing a passivation material over the semiconductor device formed in the process 200C, and then patterning the passivation material to define a cavity over the first gate structure 114. The cavity may reach the gate region 222. Metal may be deposited into the cavity to form a metal contact 224. The process 200D may include depositing a sensing material over the metal contact 224 to form a sensing element 126. A sensing cavity may be formed in the metal contact 224. The sensing element 126 may include a sensing membrane or a stack of sensing membranes formed in the sensing cavity. The sensing element 126 may be formed of for example silicon oxide, silicon nitride, aluminum oxide, combinations thereof, or other material(s) as known to those skilled in the art. The process 200D may further include removing excess sensing material from bonding pads of the semiconductor device. The resulting semiconductor device may be, or may be part of, the sensor device 100.

FIG. 2D also shows the cross-sectional view of the sensor device 100 along the line C-C'. The second well 210 may be deeper than the first well 206, since the second well 210 is formed as part of a DTI structure. In contrast, the depth of the first well 206 may bound by the depths of the isolation regions 204 which may be STI regions which are much shallower than a DTI structure. The cross-section of the first gate structure 114 and the cross-section of the second gate structure 144 along the line C-C' may be identical or at least substantially similar, with the exception of the sensing element 126 and the metal contact 224 that may be provided over the first gate structure 114. The method illustrated in FIGS. 2A-2D show that the second transistor 104 may have a channel region that is of a different conductive material from the first transistor 102, by making use of the conventional process of forming a DTI structure. In other words, the method may cleverly re-purpose the process of forming a DTI structure, to also construct the channel region of the second transistor, without adding any new process limitations to the process of fabricating a transistor.

Using the conventional process of forming a DTI structure, the channel region of the second transistor 104 may be fabricated to have a different conductive material from the channel region of the first transistor 102.

According to various non-limiting embodiments, the processes 200A, 200B, 200C and 200D may be performed sequentially in the abovementioned order.

Figure 3A:
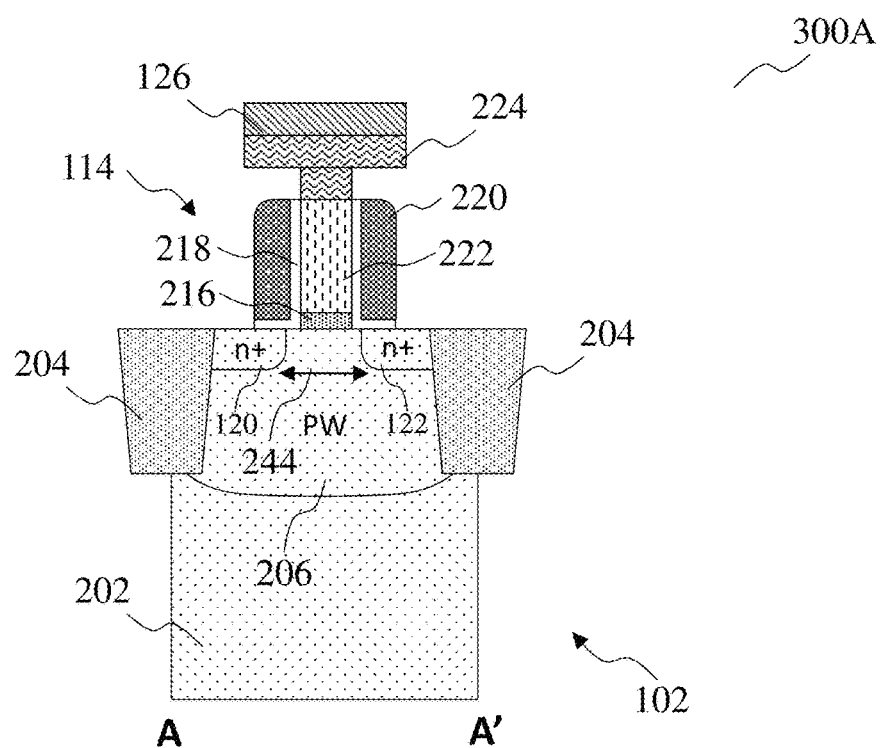
FIG. 3A illustrates a cross-sectional view of the sensor device of FIG. 1 cut across a line A-A' indicated in FIG. 1.

FIG. 3A illustrates a cross-sectional view 300A of the sensor device 100 cut across the line A-A' (indicated in FIG. 1). The line A-A' cuts across the first transistor 102. Each of the first drain region 120 and the first source region 122 may lie at least partially under the first gate structure 114. Each of the first drain region 120 and the first source region 122 may be disposed adjacent to a respective isolation region 204. A region of the first well 206 that lies at least partially between the first drain region 120 and the first source region 122 may function as a channel region of the first transistor 102.

Figure 3B:
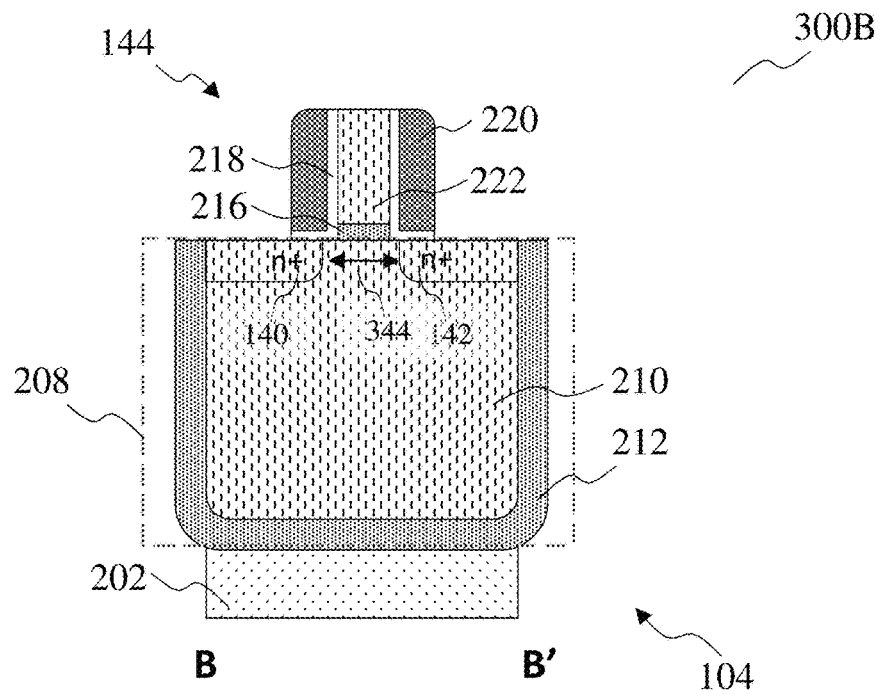
FIG. 3B illustrates cross-sectional view of the sensor device of FIG. 1 cut across a line B-B' indicated in FIG. 1.

FIG. 3B illustrates cross-sectional view 300B of the sensor device 100 cut across the line B-B' (indicated in FIG. 1).

The line B-B' cuts across the second transistor 104. The second transistor 104 may include the DTI structure 208 which may be embedded in the substrate 202. The second transistor 104 may further include the second gate structure 144 which may be disposed directly above the DTI structure 208. The DTI structure 208 may include a second well 210 which may include the second source region 142 and the second drain region 140. The second well 210 may be filled with a conductive material that has a lower mobility of carriers as compared to the first well 206. The conductive material may be polysilicon. The second drain region 140 and the second source region 142 of the second transistor 104 may be formed within the second well 210, for example, by doping regions of the second well 210 to a higher charge concentration. Each of the second drain region 140 and the second source region 142 may lie at least partially under the second gate structure 144. The second drain region 140 may extend from one end that lies underneath the second gate structure 144, to abut the insulator lining 212 at a first side of the second well 210. The second source region 140 may similarly extend from another end that lies underneath the second gate structure 144, to abut the insulator lining 212 at a second side of the second well 210. The second channel region 344 of the second transistor 104 may lie between the second source region 142 and the second drain region 140. The second gate structure 144 may be identical, or at least substantially similar, to the first gate structure 114. The second gate structure 144 may include an oxide region 216 which may lie above the second channel region 344. The oxide region 216 may be in contact with the second channel region 344, and may be provided between the gate region 222 and the second channel region 344. The oxide region 216 may be provided between the gate region 222 and the second channel region 344. The second gate structure 144 may also include spacers 218 that at least substantially surround the gate region 222. The spacers 218 may overlap two sides of the gate region 222, and may extend partly onto the second channel region 344. The second gate structure 144 may further include insulation walls 220 at least substantially overlapping the spacers 218. Both the spacers 218 and the insulation walls 220 may include electrically insulating materials, for example, oxides and nitrides, for example, silicon oxide and silicon nitrides. In a non-limiting example, the spacers 218 may include an oxide while the insulation walls 220 may include a nitride.

Figure 4:
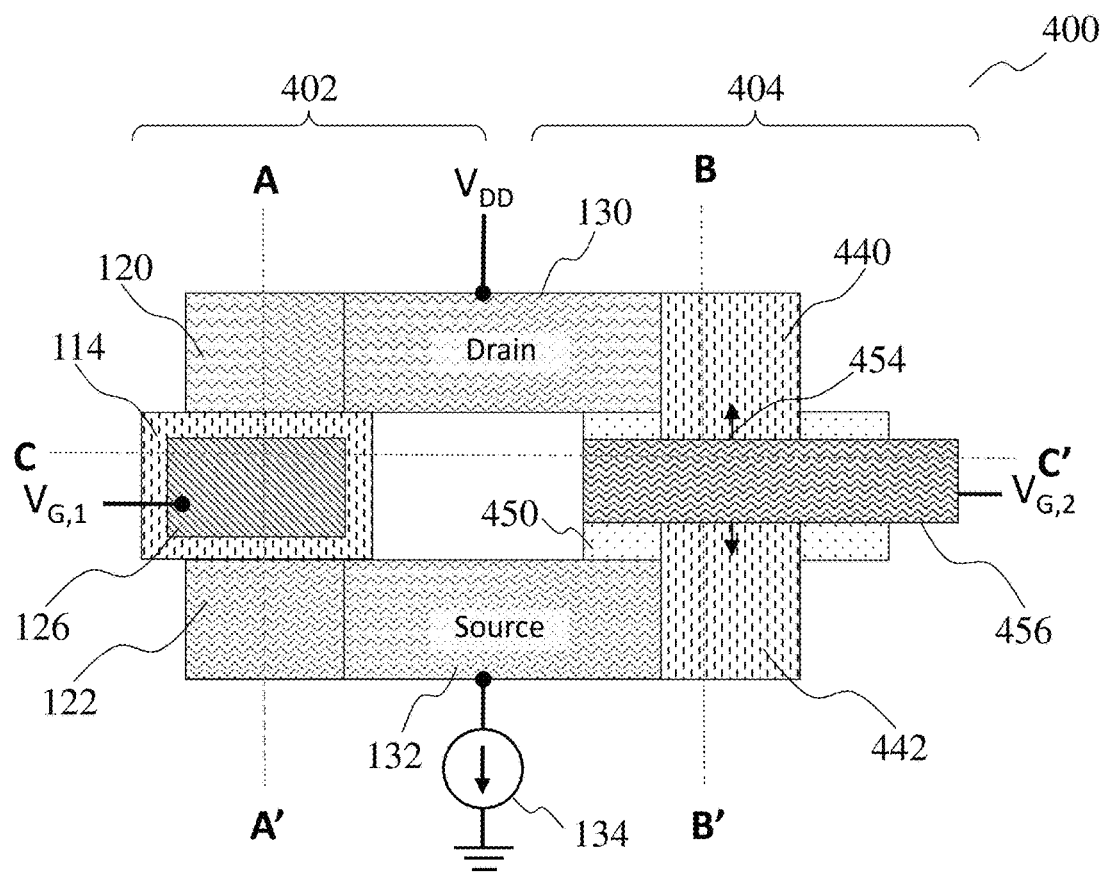
FIG. 4 illustrates a top view of a sensor device according to various non-limiting embodiments.

FIG. 4 illustrates a top view of a sensor device 400 according to various non-limiting embodiments. Like the sensor device 100, the sensor device 400 may also include a first transistor 402 and a second transistor 404. The first transistor 402 may be identical, or at least substantially similar to, the first transistor 102 of the sensor device 100. The second transistor 404 may be structurally different from the second transistor 104 of the sensor device 100, although it may be functionally identical, or at least substantially similar. The second transistor 404 may be a MOSFET. The second transistor 404 may have a second source region 442, a second drain region 440, a second channel region 454 and a second gate region 450. The second gate region 450 may be recessed as compared to a top surface of the sensor device 400, including being recessed relative to the second source region 442 and the second drain region 440. In other words, the second gate region 450 may be disposed under the second source region 442 and under the second drain region 440. The second gate region 450 may also lie at a lower level than the second channel region 454, i.e. may be arranged under the second channel region 454. The second gate region 450 may be disposed between the substrate 202 and the second channel region 454. For a frame of reference, in the first transistor 402, the order is reversed, i.e. the first channel region 244 of the first transistor 402 may be arranged between the substrate 202 and the first gate structure 114. The second gate region 450 may extend out from under the second channel region 454, for connection to a metal contact 456 for coupling to external devices. The second drain region 440 may be electrically coupled to the first drain region 120, for example, via a metal contact 130. The metal contact 130 may be arranged over a top surface of the first drain region 120 and may abut a side surface of the second drain region 440. The second source region 442 may be electrically coupled to the first source region 122, for example, via a metal contact 132. The metal contact 132 may be arranged over a top surface of the first source region 122 and may abut a side surface of the second source region 442. The second gate region 450 may be configured to output an output voltage $V_{G,2}$.

The sensor device 400 may function in the same manner as the sensor device 100. In use, the current source 134 may drive a constant current, $I_{DS}$ into the sensor device 400. An input voltage $V_{G,1}$ may be provided to the first gate structure 114 of the first transistor 402. The first drain region 120 and the second drain region 440 may be electrically coupled to a common voltage supply $V_{DD}$; whereas, the first source region 122 and the second source region 442 may be electrically coupled to the current source 134. The current flow $I_{DS}$ may branch into a first current flow $I_{DS,1}$ through the first transistor 402 and a second current flow $I_{DS,2}$ through the second transistor 404. The first gate structure 114 of the first transistor 402 may be configured to control the first current flow through the first transistor 402 based on the voltage $V_{G,1}$. When a pH of the solution-under-test changes, the voltage $V_{G,1}$ changes, and consequently, the first current flow through the first transistor 402 changes. As $I_{DS}$ remains constant, the second current flow through the second transistor 404 changes to compensate for the change in the first current flow through the first transistor 402. This in turn changes the output voltage $V_{G,2}$ at the second gate region 450 of the second transistor 404. The pH changes in the solution-under-test may be detected based on the amount of change in $V_{G,2}$.

FIGS. 5A-5D show cross-sectional views along the line C-C' (shown in FIG. 4) of the sensor device 400 at various stages of fabrication.

Figure 5A:
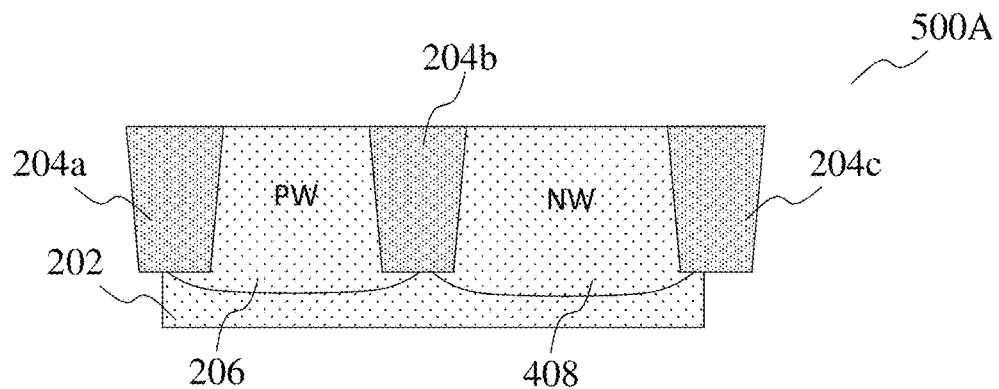
FIGS. 5A-5D show cross-sectional views along a line C-C' indicated in FIG. 4, of the sensor device of FIG. 4 at various stages of fabrication.

FIG. 5A illustrates a cross-sectional view in relation to a process 500A in a method of fabricating the sensor device 400 according to various non-limiting embodiments. The process 500A may include forming isolation regions 204a-c in the substrate 202. The isolation regions 204a-c may be provided in the form of shallow trench isolation (STI). The process 500A may include the process 200A. A centre isolation region 204b may isolate the first transistor 402 from the second transistor 404 when the sensor device 400 is formed. Each isolation region may include an isolation material, such as but not limited to, a gap fill oxide or nitride, or a combination of both. Each isolation region may have a width ranging from about 0.05 um to about 10 um in a non-limiting embodiment. A first well 206 may be formed between a first isolation region 204a and the centre isolation region 204b, in the substrate 202. A second well 408 may be formed between the centre isolation region 204b and a third isolation region 204c, in the substrate 202. Forming the first well 206 and the second well 408 may include doping regions of the substrate 202 between the respective isolation regions. The first well 206 and the second well 408 may be doped to different conductivity types, for example, the first well 206 may be doped to have p-type conductivity while the second well 408 may be doped to have n-type conductivity, or vice-versa. The first well 206 may be the starting material for forming the first source region 122, the first drain region 120, and the first channel region 244. The second well 408 may be the starting material for forming the second gate region 450. The process 500A may further include forming the first source region 122 and the first drain region 120 in the first well 206.

Figure 5B:
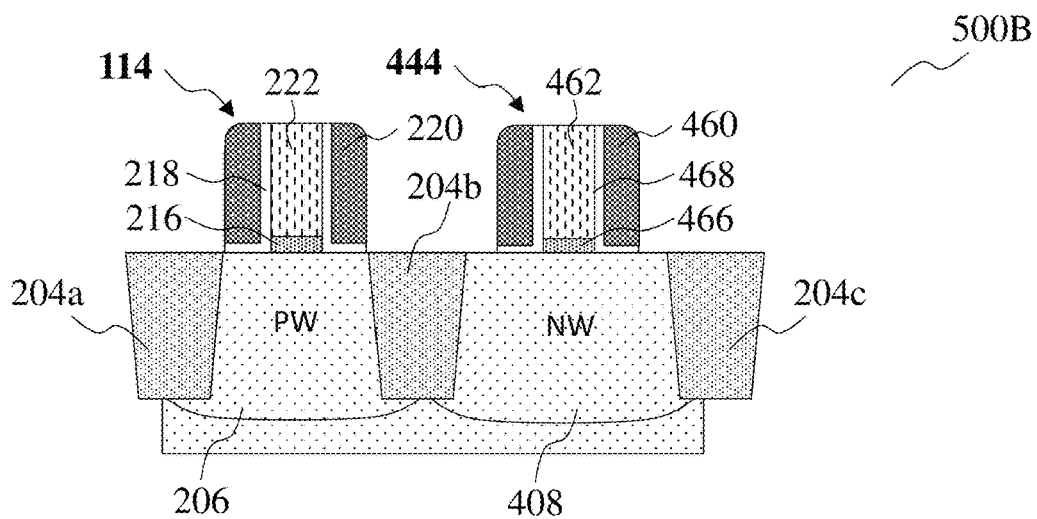

FIG. 5B illustrates a cross-sectional view in relation to a process 500B in a method of fabricating the sensor device 400 according to various non-limiting embodiments. The process 500B may include forming a first gate structure 114 for the first transistor 402 and a quasi-gate structure 444 for the second transistor 404. The semiconductor device shown in FIG. 4A may be planarized using chemical mechanical planarization (CMP), to achieve a flat and smooth surface for receiving the first gate structure 114 and the quasi-gate structure 444. The first gate structure 114 and the quasi-gate structure 444 may be fabricated concurrently, in the same process. Forming the first gate structure 114 may include depositing an oxide over the first well 206 to form a gate oxide region 216, providing spacers 218 adjacent to the gate oxide regions, forming insulation walls 220 adjacent to the spacers 218, and providing a conductive material between the spacers 218 to form the gate region 222. The gate oxide region 216 may be formed of any gate oxide material known in the art, such as high-k dielectrics or silicon dioxide in a non-limiting example. The process of forming the quasi-gate structure 444 may be identical to the process of forming the first gate structure 114, except that the second gate structure 144 may be formed over the second well 408. The cross-sections of the first gate structure 114 and the quasi-gate structure 444 when cut along the line C-C', may be identical or at least substantially similar. However, the quasi-gate structure 444 may be longer than the first gate structure 114, along the line B-B', as will be described subsequently with respect to FIG. 5. Similar to the first gate structure 114, the quasi-gate structure 444 may also include an oxide region 466, spacers 468 and insulation walls 460. The oxide region 466 may be identical to, or similar to the gate oxide region 216. The spacers 468 may be identical to, or similar to the spacers 218. The insulation walls 460 may be identical to, or similar to the insulation walls 220. A conductive material for example, polysilicon, may be disposed between the spacers 218, in the core region 462 of the quasi-gate structure 444. The core region 462 may be identical to, or similar to the gate region 222 of the first transistor 402. The core region 462 may provide the starting material for forming the second source region 442, the second drain region 440, and the second channel region 454 of the second transistor 404.

Alternatively, the first gate structure 114 may be in the form of a floating-gate structure including a cavity for receiving the solution, an intermediate layer, for example, a passivation layer beneath the cavity to detect changes in the amount and/or type of ions of the solution, and a sensing element disposed beneath the passivation layer. Other types of structures as known to those skilled in the art may also be useful for forming the first gate structure 114.

Figure 5C:
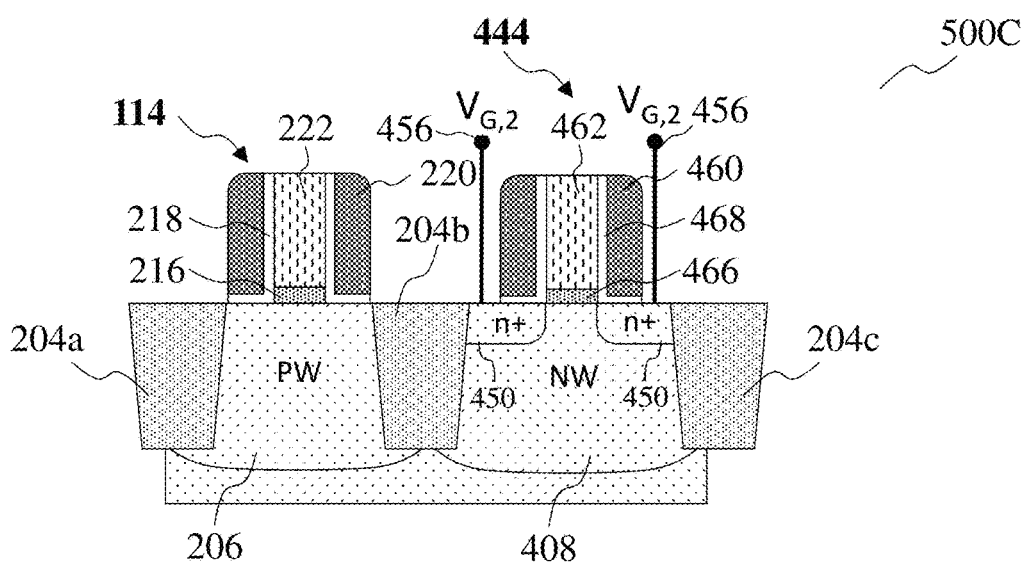

FIG. 5C illustrates a cross-sectional view in relation to a process 500C in a method of fabricating the sensor device 400 according to various non-limiting embodiments. The second transistor 404 may be a junction-less transistor, such that forming of the second source region 442, the second drain region 440 and the second channel region 454 is not needed. In other words, the doping level between the second source region 442, the second drain region 440 and the second channel region 454 may be uniform such that there is no junction between the second source region 442 or the second drain region 440, and the second channel region 454. Alternatively, the second transistor 404 may include a junction and the process 500C may further include forming the second source region 442, the second drain region 440, and the second channel region 454, which may further include, in a non-limiting embodiment, defining the second channel region 454, the second source region 442 and the second drain region 440 by lithography; followed by etching using a photoresist mask that covers the second channel region 454; stripping the photoresist mask and anneal; and activating dopants in the second source region 442 and the second drain region 440. Forming the second source region 442, the second drain region 440, and the second channel region 454 may include doping regions within the core region 462, to a higher charge concentration than remaining portions of the core region 462. The process 500C may also include forming the second gate region 450 in the second well 408, by doping regions with the second well 408. The second gate region 450 may include two sections, each section formed adjacent to a respective isolation region 204b, 204c. Each section of the second gate region 450 may partially underlie the quasi-gate structure 444. The process 500C may also include forming pick up metal contacts 456 over each section of the second gate region 450. The metal contacts 456 may be configured to output a voltage $V_{G,2}$. The process 500C may also include deposition of the interlayer dielectric (ILD). A metallization layer may be deposited, to form electrical contacts. Back end of line (BEOL) processes may be carried out to connect devices in the semiconductor device with wiring on the wafer.

Figure 5D:
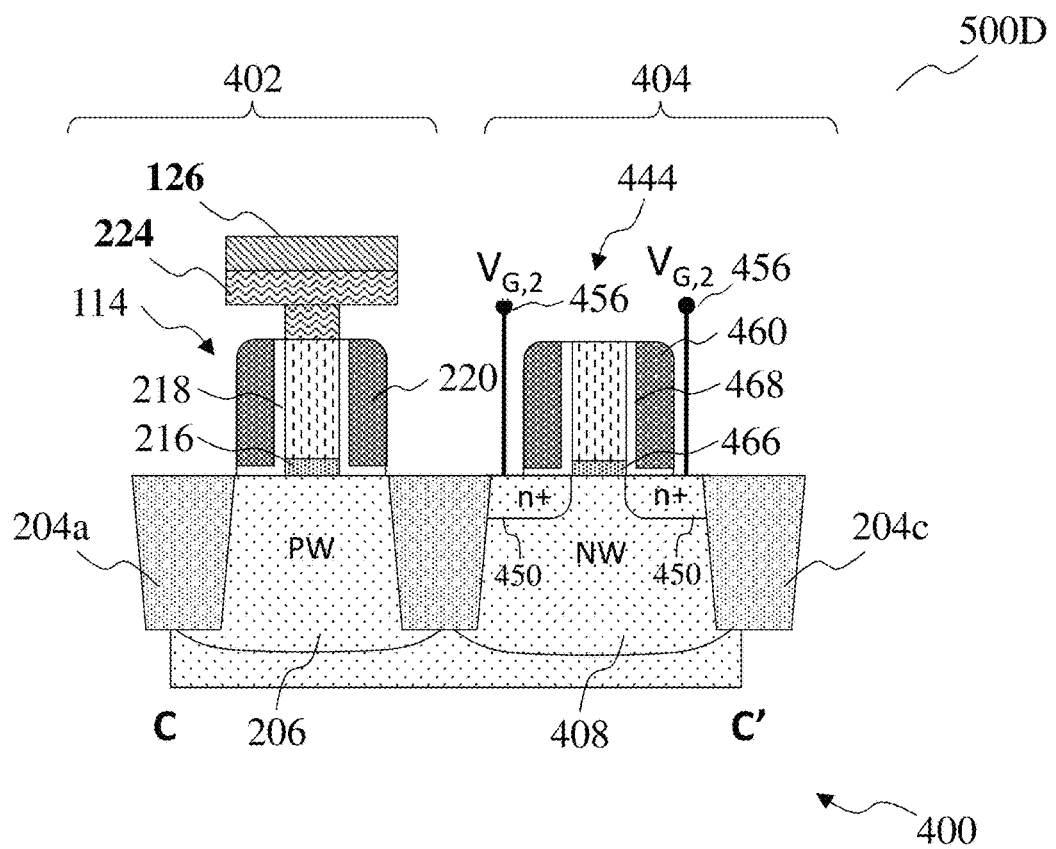

FIG. 5D illustrates a cross-sectional view in relation to a process 500D in a method of fabricating the sensor device 400 according to various non-limiting embodiments. The process 500D may include depositing a passivation material over the semiconductor device formed in the process 500C, and then patterning the passivation material to define a cavity over the first gate structure 114. The cavity may reach the gate region 222. Metal may be deposited into the cavity to form a metal contact 224. The process 500D may include depositing a sensing material over the metal contact 224 to form a sensing element 126. A sensing cavity may be formed in the metal contact 224. The sensing element 126 may include a sensing membrane or a stack of sensing membranes formed in the sensing cavity. The sensing element 126 may be formed of for example silicon oxide, silicon nitride, aluminum oxide, combinations thereof, or other material(s) as known to those skilled in the art. The process 500D may further include removing excess sensing material from bonding pads of the semiconductor device. The resulting semiconductor device may be, or may be part of, the sensor device 400. The method illustrated in FIGS. 5A-5D show that the second transistor 404 may have a channel region that is of a different conductive material from the first transistor 402, by making use of the conventional process of forming a MOSFET. The method may cleverly re-purpose the gate structure of a conventional MOSFET, to function as the channel region of the second transistor 404.

FIG. 5D also shows the cross-sectional view of the sensor device 400 along the line C-C'. The first well 206 and the second well 408 may be formed out of the same substrate 202 such that they are both disposed at the same level/depth in the wafer. The first gate structure 114 and the quasi-gate structure 444 may be disposed over the first well 206 and the second well 408 respectively, such that they are both disposed at the same level/height. The first source region 122, the first drain region 120, and the first channel region 244 in the first transistor 402 may be formed in the first well 206, i.e. embedded in the substrate 202; whereas, the second source region 442, the second drain region 440 and the second channel region 454 may be formed in the quasi-gate structure 444, i.e. above the substrate 202. The gate region 222, also referred herein as the gate terminal, of the first transistor 402 may be disposed in the first gate structure 114, i.e. above the substrate 202; whereas, the gate terminal of the second transistor 404 may be disposed in the second well 408, i.e. embedded within the substrate 202. In other words, the second transistor 404 may be inverted relative to the first transistor 402.

According to various non-limiting embodiments, the processes 500A, 500B, 500C and 500D may be performed sequentially in the abovementioned order.

A cross-sectional view of the sensor device 400 cut along the line A-A' indicated in FIG. 4 may be identical to the cross-sectional view 300A. The line A-A' cuts across the first transistor 402.

Figure 6:
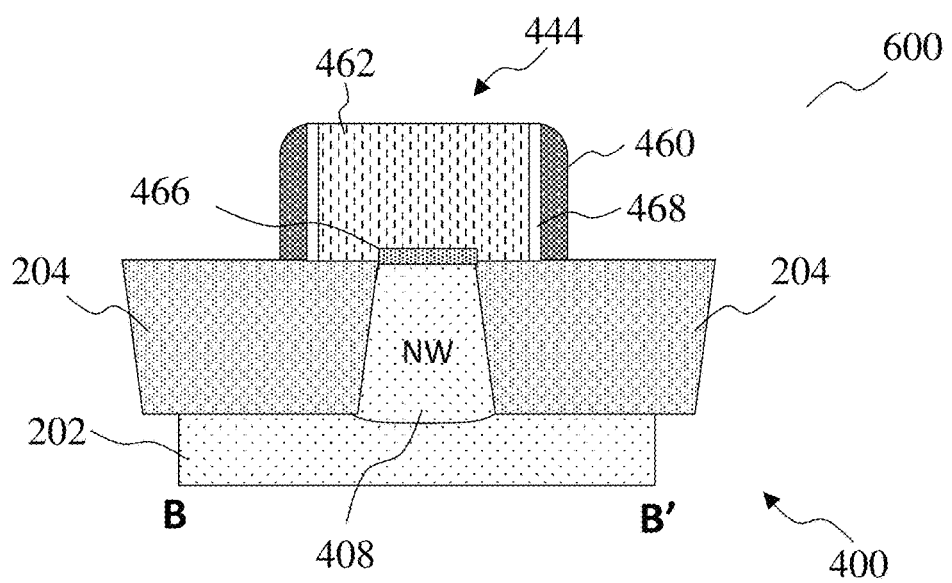
FIG. 6 illustrates a cross-sectional view of the sensor device of FIG. 4 cut along a line B-B' indicated in FIG. 4.

FIG. 6 illustrates a cross-sectional view 600 of the sensor device 400 cut along the line B-B' indicated in FIG. 4. The line B-B' cuts across the second transistor 404. The second transistor 404 may include the quasi-gate structure 444 and the second well 408. The second well 408 may be provided within the substrate 202, and between two isolation regions 204. The quasi-gate structure 444 may be provided above the second well 408 and may be longer than the second well 408, so as to extend from the second drain region 440 to the second source region 442.

According to various non-limiting embodiments, the second transistor 404 may be a junction-less transistor. The second source region 442, the second drain region 440 and the second channel region 454 may be undoped. The resistivity of the second source region 442, the second drain region 440 and the second channel region may be in a range of about 1 to 1e4 ohm-cm. By having the second transistor 404 as a junction-less transistor, the mobility of charge carriers of the second transistor 404 may be lower than if the second transistor 404 were to have a junction. Consequently, the sensor device 400 may have a higher sensitivity, due to a higher value of $\mu_1/\mu_2$.

Figure 7:
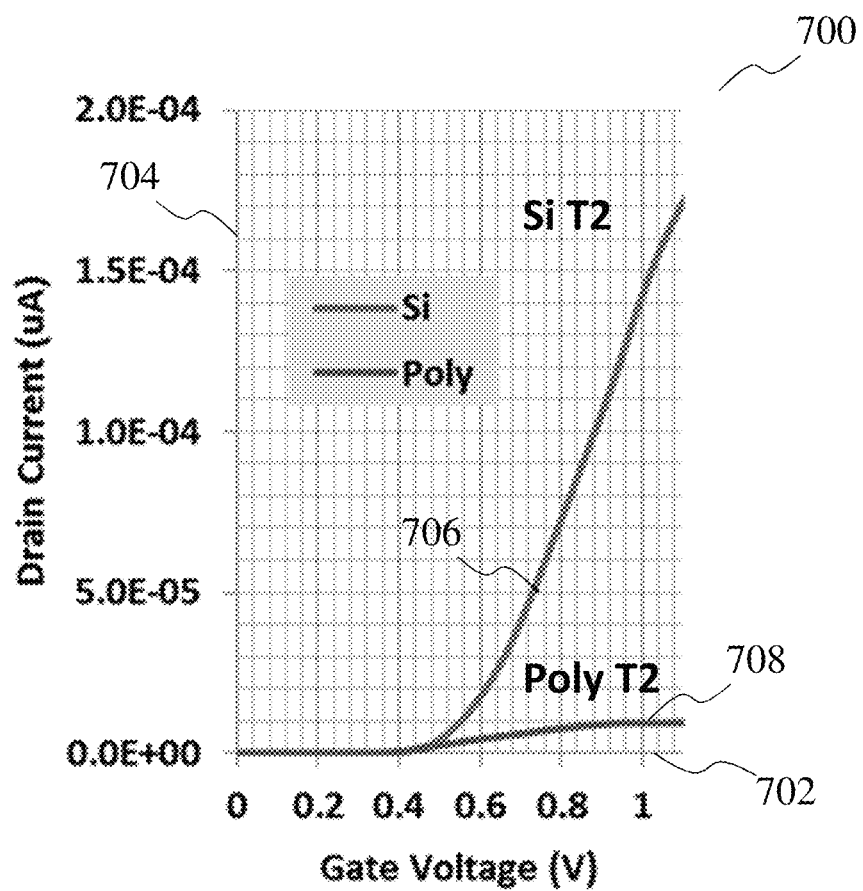
FIG. 7 shows the relationship between drain current and gate voltage in a transistor, as plotted in a graph.

FIG. 7 shows the relationship between drain current and gate voltage in a transistor, as plotted in a graph 700. The graph 700 includes a horizontal axis 702 indicating gate voltage in volts, and a vertical axis 704 indicating drain current in microamperes. The graph 700 includes a first plot 706 representing a transistor with a monocrystalline silicon channel, and a second plot 708 representing a transistor with a polysilicon channel. A ratio between the current of the transistor with the monocrystalline silicon channel and the current of the transistor with the polysilicon channel may be about 18. Referring back to Equation (3) and to the sensor device 100 or 400, if the first transistor 102 or 402 has the same gate dimensions as the second transistor 104 or 404, and assuming the intrinsic ISFET sensitivity is about 60 mV/pH, the sensitivity of the sensor device 100 or 400 may be 18 times of the intrinsic ISFET sensitivity, i.e. about 1.08V/pH.

According to various non-limiting embodiments, the first transistor 102 or 402, and the second transistor 104 or 404 may be formed on separate substrates.

According to various non-limiting embodiments, the second channel region 344 or 454 may be undoped, while the first channel region 244 may be doped, so that the second channel region is more resistive, in other words, mobility of charge carriers is lower. Consequently, the sensor device 100 or 400 may have a higher sensitivity, due to a higher value of $\mu_1/\mu_2$. The resistivity of the undoped second channel region 344 or 454 may be in a range of about 1 to 1e4 ohm-cm. The resistivity of the doped first channel region 244 may be in a range of about 1e-3 to 1e-1 ohm-cm.

The following examples pertain to further embodiments.

Example 1 may be a sensor device including: a substrate; a first semiconductor structure; and a second semiconductor structure. The first semiconductor structure may include: a first source region at least partially disposed within the substrate; a first drain region at least partially disposed within the substrate; a first channel region between the first source region and the first drain region, wherein the first channel region includes a first conductive material; a first gate structure disposed over the first channel region; and a sensing element electrically connected to the first gate structure, wherein the sensing element is configured to receive a solution. The second semiconductor structure may include: a deep trench isolation structure disposed within the substrate, wherein the deep trench isolation structure is filled with a second conductive material; a second source region at least partially disposed within the deep trench isolation structure; a second drain region at least partially disposed within the deep trench isolation structure; a second channel region disposed within the deep trench isolation structure, wherein the second channel region is disposed between the second source region and the second drain region; and a second gate structure disposed over the second channel region; wherein the first drain region is electrically coupled to the second drain region; wherein the first source region is electrically coupled to the second source region; and wherein a mobility of charge carriers of the second conductive material is lower than a mobility of charge carriers of the first conductive material.

In Example 2, the subject matter of Example 1 may optionally include that the first drain region and the second drain region are connected to a common drain voltage.

In Example 3, the subject matter of any one of Examples 1 to 2 may optionally include that the first source region and the second source region are connected to a common source voltage.

In Example 4, the subject matter of any one of Examples 1 to 3 may optionally include that the first gate structure is connected to a first gate voltage, wherein the second gate structure is connected to a second gate voltage.

In Example 5, the subject matter of any one of Examples 1 to 4 may optionally include that a change in pH in the solution causes a change in a first current flow through the first channel region.

In Example 6, the subject matter of Example 5 may optionally include that the sensor device is configured such that when the first current flow through the first channel region changes due to the change in pH in the solution, a second current flow through the second channel region changes to compensate for the change in the first current flow through the first channel region to maintain a constant current flow through the sensor device.

In Example 7, the subject matter of any one of Examples 1 to 6 may optionally include that the first semiconductor structure is an ion-sensitive field-effect transistor (ISFET).

In Example 8, the subject matter of any one of Examples 1 to 7 may optionally include that the second semiconductor structure is a metal-oxide-semiconductor field-effect transistor (MOSFET).

In Example 9, the subject matter of any one of Examples 1 to 8 may optionally include that the first conductive material is monocrystalline silicon, wherein the second conductive material is polysilicon.

In Example 10, the subject matter of any one of Examples 1 to 9 may optionally include that the first conductive material has a doping level ranging from $10^{-3}$ ohm-cm to $10^{-1}$ ohm-cm, wherein the second conductive material has a doping level ranging from 1 ohm-cm to $10^4$ ohm-cm.

Example 11 may be a sensor device including: a substrate; a first semiconductor structure and a second semiconductor structure. The first semiconductor structure may include: a first source region at least partially disposed within the substrate; a first drain region at least partially disposed within the substrate; a first channel region disposed within the substrate, between the first source region and the first drain region, wherein the first channel region including a first conductive material; a first gate structure disposed over the first channel region; and a sensing element electrically connected to the first gate structure, wherein the sensing element is configured to receive a solution. The second semiconductor structure may include: a second channel structure disposed over the substrate, wherein the second channel structure is filled with a second conductive material; a second source region at least partially disposed within the second channel structure; a second drain region at least partially disposed within the second channel structure; a second channel region disposed within the second channel structure, wherein the second channel region is disposed between the second source region and the second drain region; and a second gate region disposed within the substrate and under the second channel region; wherein the first drain region is electrically coupled to the second drain region; wherein the first source region is electrically coupled to the second source region; and wherein a mobility of charge carriers of the second conductive material is lower than a mobility of charge carriers of the first conductive material.

In Example 12, the subject matter of Example 11 may optionally include that the first drain region and the second drain region are connected to a common drain voltage.

In Example 13, the subject matter of any one of Examples 11 to 12 may optionally include that the first source region and the second source region are connected to a common source voltage.

In Example 14, the subject matter of any one of Examples 11 to 13 may optionally include that the first gate structure is connected to a first gate voltage, wherein the second gate region is connected to a second gate voltage.

In Example 15, the subject matter of any one of Examples 11 to 14 may optionally include that a change in pH in the solution causes a change in a first current flow through the first channel region.

In Example 16, the subject matter of Example 15 may optionally include that the sensor device is configured such that when the first current flow through the first channel region changes due to the change in pH in the solution, a second current flow through the second channel region changes to compensate for the change in the first current flow through the first channel region to maintain a constant current flow through the sensor device.

In Example 17, the subject matter of any one of Examples 11 to 16 may optionally include that the first semiconductor structure is an ion-sensitive field-effect transistor (ISFET).

In Example 18, the subject matter of any one of Examples 11 to 17 may optionally include that the second semiconductor structure is a metal-oxide-semiconductor field-effect transistor (MOSFET).

In Example 19, the subject matter of any one of Examples 11 to 18 may optionally include that the first conductive material is monocrystalline silicon, wherein the second conductive material is polysilicon.

In Example 20, the subject matter of any one of Examples 11 to 19 may optionally include that the first conductive material has a doping level ranging from $10^{-3}$ ohm-cm to $10^{-1}$ ohm-cm, wherein the second conductive material has a doping level ranging from 1 ohm-cm to $10^4$ ohm-cm.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

It will be appreciated to a person skilled in the art that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The invention claimed is:

1. A sensor device comprising:
   a substrate;
   a first semiconductor structure comprising:
      a first source region at least partially disposed within the substrate;
      a first drain region at least partially disposed within the substrate;
      a first channel region disposed within the substrate, between the first source region and the first drain region, wherein the first channel region comprising a first conductive material;
      a first gate structure disposed over the first channel region; and
      a sensing element electrically connected to the first gate structure, wherein the sensing element is configured to receive a solution;
   a second semiconductor structure comprising:
      a second channel structure disposed over the substrate, wherein the second channel structure is filled with a second conductive material;
      a second source region at least partially disposed within the second channel structure;
      a second drain region at least partially disposed within the second channel structure;
      a second channel region disposed within the second channel structure, wherein the second channel region is disposed between the second source region and the second drain region; and
      a second gate region disposed within the substrate and under the second channel region;
   wherein the second source region, the second drain region and the second channel region are undoped;
   wherein the first drain region is electrically coupled to the second drain region;
   wherein the first source region is electrically coupled to the second source region; and
   wherein a mobility of charge carriers of the second conductive material is lower than a mobility of charge carriers of the first conductive material.

2. The sensor device of claim 1, wherein the first drain region and the second drain region are connected to a common drain voltage.

3. The sensor device of claim 1, wherein the first source region and the second source region are connected to a common source voltage.

4. The sensor device of claim 1, wherein the first gate structure is connected to a first gate voltage, wherein the second gate region is connected to a second gate voltage.

5. The sensor of claim 1, wherein a change in pH in the solution causes a change in a first current flow through the first channel region.

6. The sensor of claim 5, wherein the sensor device is configured such that when the first current flow through the first channel region changes due to the change in pH in the solution, a second current flow through the second channel region changes to compensate for the change in the first current flow through the first channel region to maintain a constant current flow through the sensor device.

7. The sensor of claim 1, wherein the first semiconductor structure is an ion-sensitive field-effect transistor (ISFET).

8. The sensor device of claim 1, wherein the second semiconductor structure is a metal-oxide-semiconductor field-effect transistor (MOSFET).

9. The sensor device of claim 1, wherein the first conductive material is monocrystalline silicon, wherein the second conductive material is polysilicon.

10. The sensor device of claim 1, wherein the first conductive material has a doping level ranging from $10^{-3}$ ohm-cm to $10^{-1}$ ohm-cm, wherein the second conductive material has a doping level ranging from 1 ohm-cm to $10^4$ ohm-cm.

11. The sensor device of claim 1, wherein the second semiconductor structure comprises a quasi-gate structure disposed over the second channel region, the quasi-gate structure being longer than the first gate structure and being longer than the second channel region.

12. The sensor device of claim 11, wherein the width of the quasi-gate structure is comparable with the width of the first gate structure.

* * * * *